(12) United States Patent
Tilsch et al.

(10) Patent No.: US 8,163,144 B2
(45) Date of Patent: Apr. 24, 2012

(54) MAGNETRON SPUTTERING DEVICE

(76) Inventors: Markus K. Tilsch, Santa Rosa, CA (US); Richard I. Seddon, Santa Rosa, CA (US); Georg J. Ockenfuss, Santa Rosa, CA (US); Jeremy Hayes, Santa Rosa, CA (US); Robert E. Klinger, Rohnert Park, CA (US)

( * ) Notice: Subject to any disclaimer, the term of this patent is extended or adjusted under 35 U.S.C. 154(b) by 1426 days.

(21) Appl. No.: 11/205,398

(22) Filed: Aug. 17, 2005

(65) Prior Publication Data
US 2006/0070877 A1    Apr. 6, 2006

Related U.S. Application Data

(63) Continuation-in-part of application No. 11/177,465, filed on Jul. 8, 2005, now Pat. No. 7,879,209, which is a continuation-in-part of application No. 11/074,249, filed on Mar. 7, 2005, now abandoned.

(60) Provisional application No. 60/603,211, filed on Aug. 20, 2004.

(51) Int. Cl.
*C23C 14/00* (2006.01)

(52) U.S. Cl. ......... 204/298.14; 204/298.01; 204/298.26; 204/298.07

(58) Field of Classification Search ............ 204/298.01, 204/298.23, 298.25, 298.27
See application file for complete search history.

(56) References Cited

U.S. PATENT DOCUMENTS

| | | | |
|---|---|---|---|
| 3,616,452 A | 10/1971 | Bessot et al. | 204/298.06 |
| 4,131,533 A * | 12/1978 | Bialko et al. | 204/298.14 |
| 4,169,031 A | 9/1979 | Brors | 204/192 R |
| 4,222,345 A | 9/1980 | Bergfelt | 118/720 |
| 4,250,009 A | 2/1981 | Cuomo et al. | 204/192.11 |
| 4,478,702 A | 10/1984 | Gillery et al. | 204/298 |
| 4,610,770 A * | 9/1986 | Saito et al. | 204/192.1 |
| 4,744,880 A | 5/1988 | Gillery et al. | 204/298 |
| 5,269,896 A | 12/1993 | Munemasa et al. | 204/192.38 |
| 5,334,298 A | 8/1994 | Gegenwart | 204/192.12 |

(Continued)

FOREIGN PATENT DOCUMENTS

DE        3934887        4/1990

(Continued)

OTHER PUBLICATIONS

Machine Translation to Shimokawa (JP 2001-323371) published on Nov. 22, 2001.*
H. A. Macleod, "Thin-Film Optical Filters", third edition, Institute of Physics Publishing, Dirac House, Temple Back, Bristol BS1 6BE, UK, 2001, pp. 488-493.

(Continued)

*Primary Examiner* — Keith Hendricks
*Assistant Examiner* — John Brayton
(74) *Attorney, Agent, or Firm* — Matthew A. Pequignot; Pequignot + Myers

(57) ABSTRACT

The present invention relates to a magnetron sputtering device and technique for depositing materials onto a substrate at a high production rate in which the deposited films have predictive thickness distribution and in which the apparatus can operate continuously and repeatedly for very long periods. The present invention has realized increased production by reducing cycle time. Increased coating rates are achieved by coupling a planetary drive system with a large cathode. The cathode diameter is greater than the diameter of a planet and less than twice the diameter of the planet. Lower defect rates are obtained through the lower power density at the cathode which suppresses arcing, while runoff is minimized by the cathode to planet geometry without the use of a mask.

22 Claims, 14 Drawing Sheets

U.S. PATENT DOCUMENTS

| | | | | |
|---|---|---|---|---|
| 5,399,252 A | * | 3/1995 | Scherer et al. | 204/298.19 |
| 5,525,199 A | * | 6/1996 | Scobey | 204/192.26 |
| 5,573,596 A | | 11/1996 | Yin | 118/723 E |
| 5,683,558 A | | 11/1997 | Sieck et al. | 204/192.12 |
| 5,736,021 A | | 4/1998 | Ding et al. | 204/298.11 |
| 5,795,448 A | | 8/1998 | Hurwitt et al. | 204/192.1 |
| 5,851,365 A | | 12/1998 | Scobey | 204/192.12 |
| 5,911,861 A | | 6/1999 | Dubs et al. | 204/298.27 |
| 5,925,227 A | * | 7/1999 | Kobayashi et al. | 204/298.25 |
| 6,117,279 A | * | 9/2000 | Smolanoff et al. | 204/192.12 |
| 6,190,513 B1 | | 2/2001 | Forster et al. | 204/192.12 |
| 1,015,438 A1 | | 8/2001 | Callegari et al. | 257/40 |
| 2003/0116432 A1 | * | 6/2003 | Schweitzer et al. | 204/298.11 |
| 2004/0118678 A1 | * | 6/2004 | Hartig | 204/298.07 |

FOREIGN PATENT DOCUMENTS

| | | | |
|---|---|---|---|
| JP | 61010239 | | 1/1986 |
| JP | 2001323371 A | * | 11/2001 |
| RU | 2008501 | | 2/1994 |
| WO | 02/19379 | | 3/2002 |

OTHER PUBLICATIONS

Philip Baumeister, "Optical Coating Technology", SPIE, Bellingham, WA, 2004, pp. 9-22 to 9-43.

U.S. Appl. No. 10/968,642, filed Oct. 19, 2004, Seddon et al.

P. Sieck: "Effect of Anode Location on Deposition Profiles for Long Rotatable Magnetrons", SVC, 37th Annual Technical Conf. Proceed., 233, (1994).

J.R. Doyle et al., "Effect of Anode Bias on Plasma Confinement in Direct Current Magnetron Discharges", J. Vac. Sci. Technol., A12(3), pp. 886-888, May/Jun. 1994.

S. Schiller, K. Goedicke, V. Kirchhoff, T. Kopte, "Pulsed Technology—a new era of magnetron sputtering", 38th Annual Technical Conference of SVC, Apr. 1995.

P. Sieck, "Active Control of Anode Current Distribution for D.C. Reactive Sputtering of $SiO_2$ and $Si_3N_4$", Surface and Coatings Technology, 68/69, pp. 794-798, 1994.

Richard Scholl et al., "Redundant Anode Sputtering: A Novel Approach to the Disappearing Anode Problem", http://www.advanced-energy.com/unload/white2.pdf, 2000.

* cited by examiner

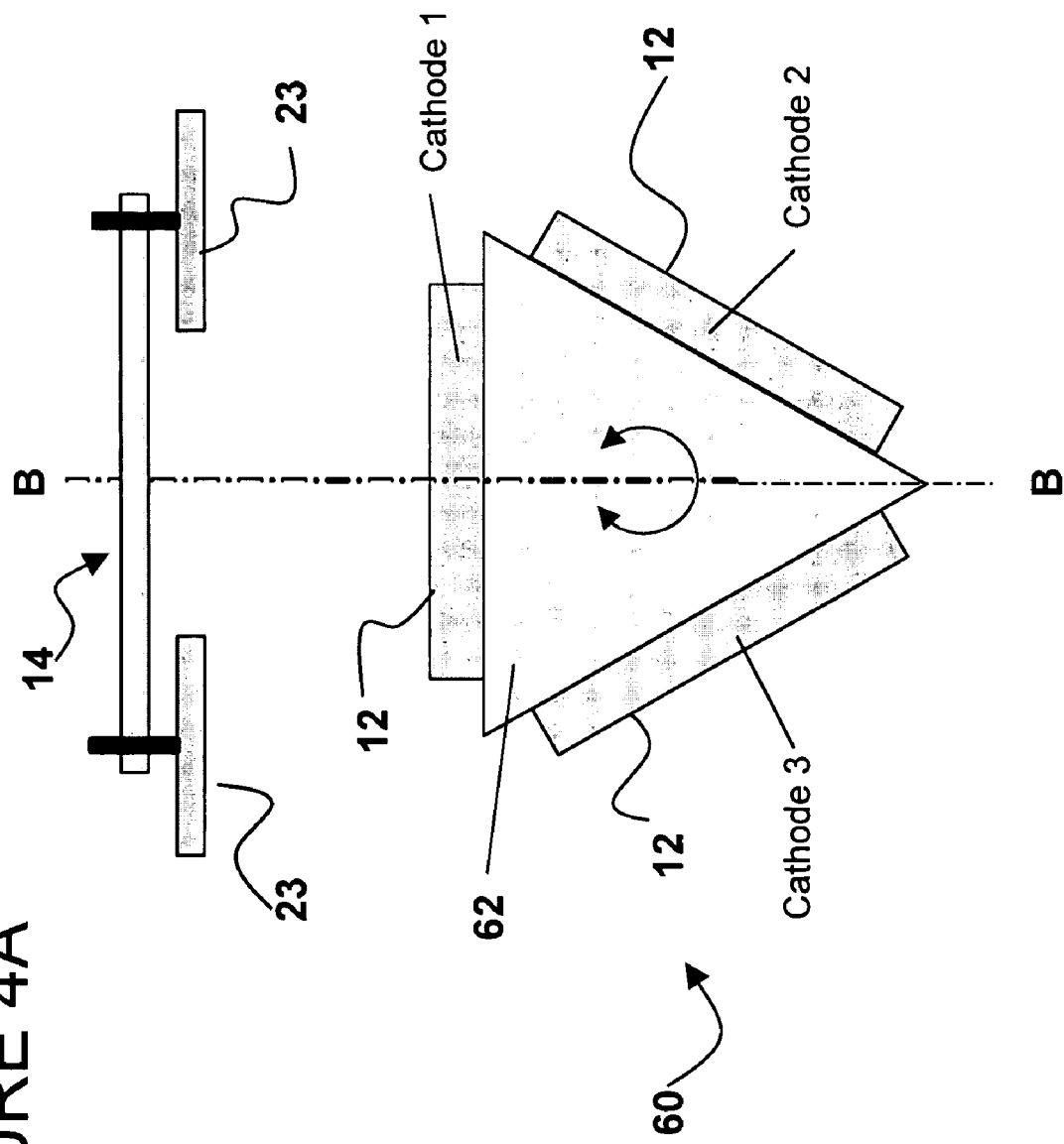

MAGNETRON SPUTTERING DEVICE

CROSS-REFERENCE TO RELATED APPLICATIONS

The present application is a continuation-in-part of U.S. patent application Ser. No. 11/177,465 filed Jul. 8, 2005, now U.S. Pat. No. 7,879,209 which is a continuation-in-part of U.S. patent application Ser. No. 11/074,249 filed on Mar. 7, 2005, now abandoned each of which claims priority from U.S. provisional application No. 60/603,211 filed Aug. 20, 2004, which are all incorporated herein by reference for all purposes.

FIELD OF THE INVENTION

This invention relates generally to an apparatus and method for depositing films on a substrate, and more particularly to a magnetron sputtering device and technique for depositing materials onto substrates at a higher production rate, in which the deposited films have predictive thickness distribution with low defect levels and in which the apparatus can operate continuously and repeatedly for very long periods.

BACKGROUND OF THE INVENTION

In a sputtering deposition process ions are usually created by collisions between gas atoms and electrons in a glow discharge. The ions are accelerated into the target cathode by an electric field causing atoms of the target material to be ejected from the cathode surface. A substrate is placed in a suitable location so that it intercepts a portion of the ejected atoms. Thus, a coating of target material is deposited on the surface of the substrate.

Sputter coating is a widely used technique for depositing a thin film of material on a substrate. Sputtering is the physical ejection of material from a target as a result of gas ion bombardment of the target. In one form of this technique, known as DC sputtering, positive ions from a plasma discharge formed between an anode and a target cathode are attracted to and strike the target cathode, dislodging atoms from the target surface of the cathode thereby providing sputtering atoms. Some of the dislodged atoms impinge on the surface of the substrate and form a coating. In reactive sputtering a gaseous species is also present at the substrate surface and reacts with, and in some embodiments combines with, the atoms from the target surface to form the desired coating material.

In operation, when the sputter gas, e.g. argon is admitted into a coating chamber, the DC voltage applied between the target cathode and the anode ignites the argon into a plasma, and the positively charged argon ions are attracted to the negatively charged target. The ions strike the target with a substantial energy and cause target atoms or atomic clusters to be sputtered from the target. Some of the target particles strike and deposit on the wafer or substrate material to be coated, thereby forming a film.

In an endeavor to attain increased deposition rates and lower operating pressures, magnetically enhanced targets have been used. In a planar magnetron, the cathode includes an array of permanent magnets arranged in a closed loop and mounted in a fixed position in relation to the flat target plate. Thus, the magnetic field causes the electrons to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability thereby leading to a much higher sputtering rate than that obtained without the use of magnetic confinement. Furthermore, the sputtering process can be accomplished at a much lower gas pressure.

A limitation to the utility of planar and cylindrical magnetrons in either reactive or non-reactive sputtering is that films deposited by sputtering have not achieved the degree of uniformity or repeatability required for many high precision applications.

It is desired to create a magnetron sputtering system that increases production and product uniformity across an individual substrate, from device to device and from run to run. Device geometry, particularly the relationship between the cathode and the objects to be coated, has a significant effect on the rate of deposition and the area coated, as well as product quality and consistency. Variation in layer thickness across a substrate is referred to as runoff. The runoff can be predicted through modeling the device geometry.

In many coating apparatuses masking is used to reduce the coating rate variation to acceptable levels. But over time the masks typically accumulate large amounts of coating material. Once the material reaches a critical thickness it may flake off and contribute to particles that compromise the coating quality. Also trimming and maintaining such masks are elaborate processes. It is desired to provide a device that does not use a mask.

The device geometry of rotating a single substrate around its own axis with an offset cathode where the vertical and lateral distance of the cathode to the substrate is about the same is well known. This geometry leads to low runoff without the use of a mask. However, much coating material is wasted in this configuration. References to this can be found, for example, in H. A. Macleod: Thin-Film Optical Filters (Institute of Physics Publishing, Dirac House, Temple Back, Bristol BS1 6BE, UK, 2001) and in P. Baumeister: Optical Coating Technology (SPIE, Bellingham, Wash.), 2004.

Alternatively, supporting multiple substrates on a multiple axis planetary drive system is also well known. This configuration is also discussed in the MacLeod and Baumeister references.

Positioning the central axis of a planetary drive system on axis with the center point of the cathode target, is demonstrated in Scobey U.S. Pat. No. 5,851,365 and also Baumeister chapter (9-37), which states, "it is advisable to position the source not far from the center of rotation to avoid large vapor impingement angles." Bergfelt U.S. Pat. No. 4,222,345 also discloses an on axis geometry to minimize excursion per revolution but this device requires a special mask or large runoff results. The cathode target in Bergfelt is not specified. It appears to be a point source.

The device disclosed by Scobey U.S. Pat. No. 5,851,365 is a relatively slow, large batch size machine, which processes 15 inch substrates in the planetary drive. The size of this device makes it difficult to maintain the drive system at good tolerances, causing variation in coating quality and runoff. The attempt to increase production by increasing batch size is further limited by increased defect losses and reduced yield.

It is an object of this invention to provide a magnetron sputter coating device with a geometry that provides rapid coating while maintaining high coating quality and minimizing material waste.

It is an object of this invention to provide a magnetron sputter coating device and method of operation that further increases production by decreasing cycle time.

It is a further object of this invention to provide a sputter coating device that produces high quality coatings without the use of a mask.

SUMMARY OF THE INVENTION

The present invention has realized increased production by reducing cycle time, thereby increasing throughput, rather than by increasing batch size. Further improvement in productivity is achieved by increasing product quality and uniformity. The present invention has found a geometry that increases coating rates through the use of a large cathode in conjunction with a planetary drive system, while maintaining low defect levels by lowering power density on the cathode. This is achieved by employing a new device geometry the device geometry between the cathode and substrate aligned to a central planetary axis.

Accordingly, the invention provides a magnetron sputtering device for applying a coating to an object comprising:
- a planetary drive system including a central rotational axis and a plurality of planets disposed substantially equidistant from the central rotational axis, each planet having a secondary axis adapted for independent rotation and a diameter defining a coating area, each planet adapted to support one or more objects in an object plane, wherein a distance from the central rotational axis to the secondary axes comprises a rotation radius of the planetary drive system;
- a circular cathode including a target comprising material for forming the coating disposed a throw distance from the object plane, the cathode having a center point, and having a cathode diameter greater than the planet diameter and up to twice the planet diameter;
- anode means for providing a voltage difference to the cathode;
- a chamber for housing the cathode and the planetary drive system adapted to be evacuated in operation; and
- a gas delivery system for providing a flow of sputter gas into the chamber, wherein the rotation radius of the planetary drive system and the throw distance are between half and twice the size of the planet diameter thereby providing minimized radial runoff of the coating quality without the use of a mask.

The invention further comprises a magnetron sputtering device for applying a coating to an object comprising:
- an electrically charged cathode including a target comprising material for forming the coating, the cathode having a center point;
- a planetary drive system disposed a throw distance from the source including a central rotational axis and a plurality of planets each supported on a secondary axis adapted for independent rotation and disposed equidistant from the central rotational axis, each planet adapted to support an object through two degrees of rotational movement;
- electrically charged anode means for providing a voltage difference to the cathode;
- a chamber for housing the cathode and the planetary drive system adapted to be evacuated to reduced pressure in operation; and
- a gas delivery system for supplying a sputter gas to the chamber for forming a plasma, wherein each of the plurality of planets has a diameter d, each secondary axis is disposed at a rotation radius r such that $0.85*d<r<1.3*d$, the throw distance t between the cathode and the planetary drive system is $0.7*d<t<1.3*d$, and the cathode circumscribes material having a cathode diameter CD about its center point such that $d<CD<2*d$.

BRIEF DESCRIPTION OF THE DRAWINGS

Exemplary embodiments of the invention will now be described in accordance with the drawings, in which:

FIG. 4A is a schematic end view of a cathode exchange mechanism in relation to the planetary drive system within the coating chamber;

DETAILED DESCRIPTION

Figure 1:
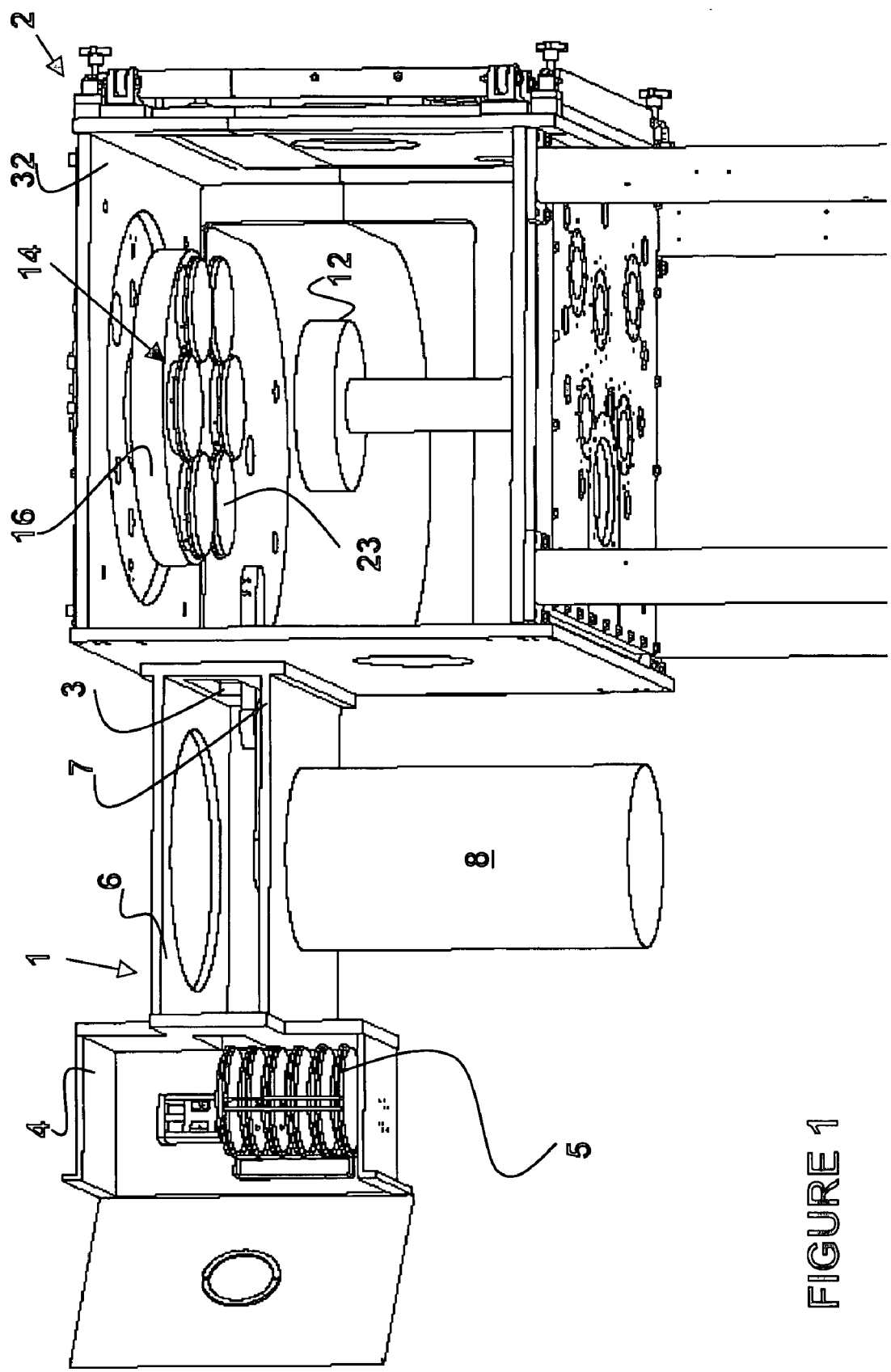
FIG. 1 is an isometric view of the coating system of the present invention with some outer wall removed.

The present invention encompasses a unique geometry for a magnetron sputter coating device optimized to produce coatings at high coating rates with high throughput. This geometry effectively increases throughput by reducing cycle time. At the same time, the device geometry is guided by a need for high optical film quality and high precision. Optical films must have low defect levels, low scatter and absorption losses. High throughput depends also on high precision to prevent losses due to coating thickness variation, part to part variation or run to run variation.

Throughput can be defined as the load size per cycle time multiplied by the uptime percentage.

Throughput=Load Size/Cycle Time*Uptime Percentage

The load size of a coating chamber is the substrate area that is coated in one cycle of the machine. The cycle time of a coating machine is the time it takes to coat one batch of substrates or other objects and includes all ancillary processes prior to and also after coating. It is actually the time between performing one operation and the time to execute the same operation on the next run. The uptime percentage is the percentage of time when the coating apparatus is available for coating. The remaining percentage is attributed to planned and unplanned downtime for refurbishment, conditioning and repairs of the equipment.

Cycle time consists of load time, setup time, actual coating time, coating overhead time and unload time. Load time is the time required for loading the substrates into the coating apparatus. Setup time is the time required for programming the tool, equalizing coating conditions, etc. Actual coating time is the time required for depositing the layers of the design. It is determined by the physical deposition rate of the material or materials. Coating overhead time is the time in addition to actual coating time spent switching from one material to the next one or burning in and cooling off the deposited layers before and after coating. Unload time is the time required for unloading the coated substrates or objects from the coating apparatus.

In many coating device designs the throughput is maximized by increasing the load size by using a large chamber. Increasing the size of the chamber makes it more difficult to control the coating process and typically, process precision is sacrificed. In the present invention throughput is maximized without sacrificing efficiency by reducing cycle time. The load size of the preferred embodiment is six 200 mm diameter substrates. The area equates to 300 in$^2$. This size is small compared to most prior art apparatuses that are built for the deposition of the same coating products, such as Scobey discussed above. Furthermore, Scobey operates a 4 or 6 inch diameter cathode, compared to the 12 inch cathode used in the present invention. The power density (power per target area) on the larger target is 2 to 5 times smaller for the same total power. It has been observed that the arc rate is correlated with the power density. Thus, an important advantage of the present invention is realized in a lower defect density in the films produced, attributable to the significantly lower power density on the target.

A further advantage of the present invention is realized in the reactive process. In accordance with the present invention, a large cathode is provided to reduce arcing while maintaining a high deposition rate. A geometry to maintain low runoff compatible with the larger cathode dictates a shorter throw distance. In the reactive process, this shorter throw distance enables the reactive source to be located closer to the substrates without getting coated up excessively with sputtered target material from the cathode. The source location of the reactive gas closer to the substrates enables more efficient oxidation (for example) contributing to a 3 to 5 times higher coating rate for oxides in the present invention. Using an average coating rate for a reactive coating process of 1.35 nm/s, 405 in$^2$ nm/s can be produced in accordance with the present invention, excluding any time to switch targets or load and unload parts. This throughput is over 30% higher than Scobey's machine, while the cycle time has the potential of being 3 to 5 times shorter. This is a major advantage for a manufacturing process. Such a short coating time allows for much faster feedback loops that improve quality and yields. It allows for short development cycles and good responsiveness to the customers' changing needs.

A preferred embodiment of the sputter coating device is shown in FIG. 1 including a load lock chamber, generally indicated at 1, and a coating chamber 2 with a gate valve 3 therebetween. A cathode 12, and a planetary drive system 14 for supporting substrates or other objects 23 for coating are mounted within the coating chamber 2.

Figure 2:
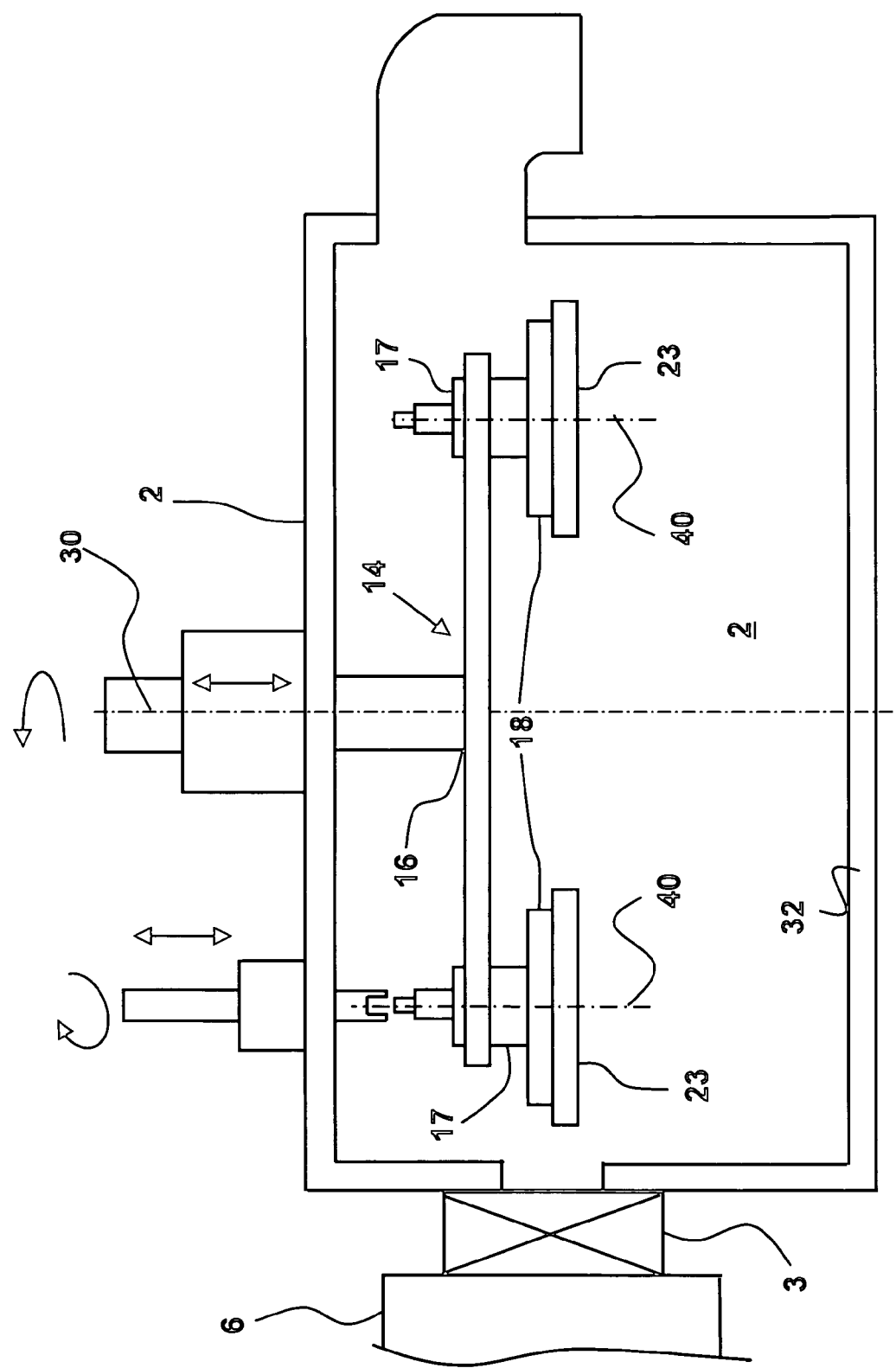
FIG. 2 is a schematic side view of the interior of the coating chamber of FIG. 1 illustrating details of the planetary drive system.

The planetary drive system 14 seen in greater detail in FIG. 2 comprises a main cylindrical platform 16 rotatable about a central rotational axis 30, with a plurality of, e.g. six, planets 17 extending therefrom, each planet 17 independently rotatable about its own secondary axis 40. Independent rotation may comprise a coordinated rotation rate relative to the rotation about the central rotational axis 30. The secondary axes are preferably parallel to the central rotational axis 30, but may be at some other angle. A center point C (FIG. 2A) of the cathode 12 is preferably aligned with the central rotational axis 30 of the planetary drive system 14 defining a central axis of the device. The cathode 12 can be displaced from the central rotational axis up to one third of the cathode diameter. Each planet 17 is disposed to experience substantially the same conditions as every other planet 17. In the preferred embodiment each planet 17 includes a magnetic latch 18 at the outer free end thereof for supporting a substrate or other object 23 opposite the cathode 12. Further details of a preferred magnetic latch are disclosed in U.S. Ser. No. 10/968,642 owned by the assignee of the present invention and herein incorporated by reference. The device is depicted here in the sputter up configuration. However, the geometry of the present invention applies equally to a sputter down, horizontal, or other orientation.

Figure 2A:
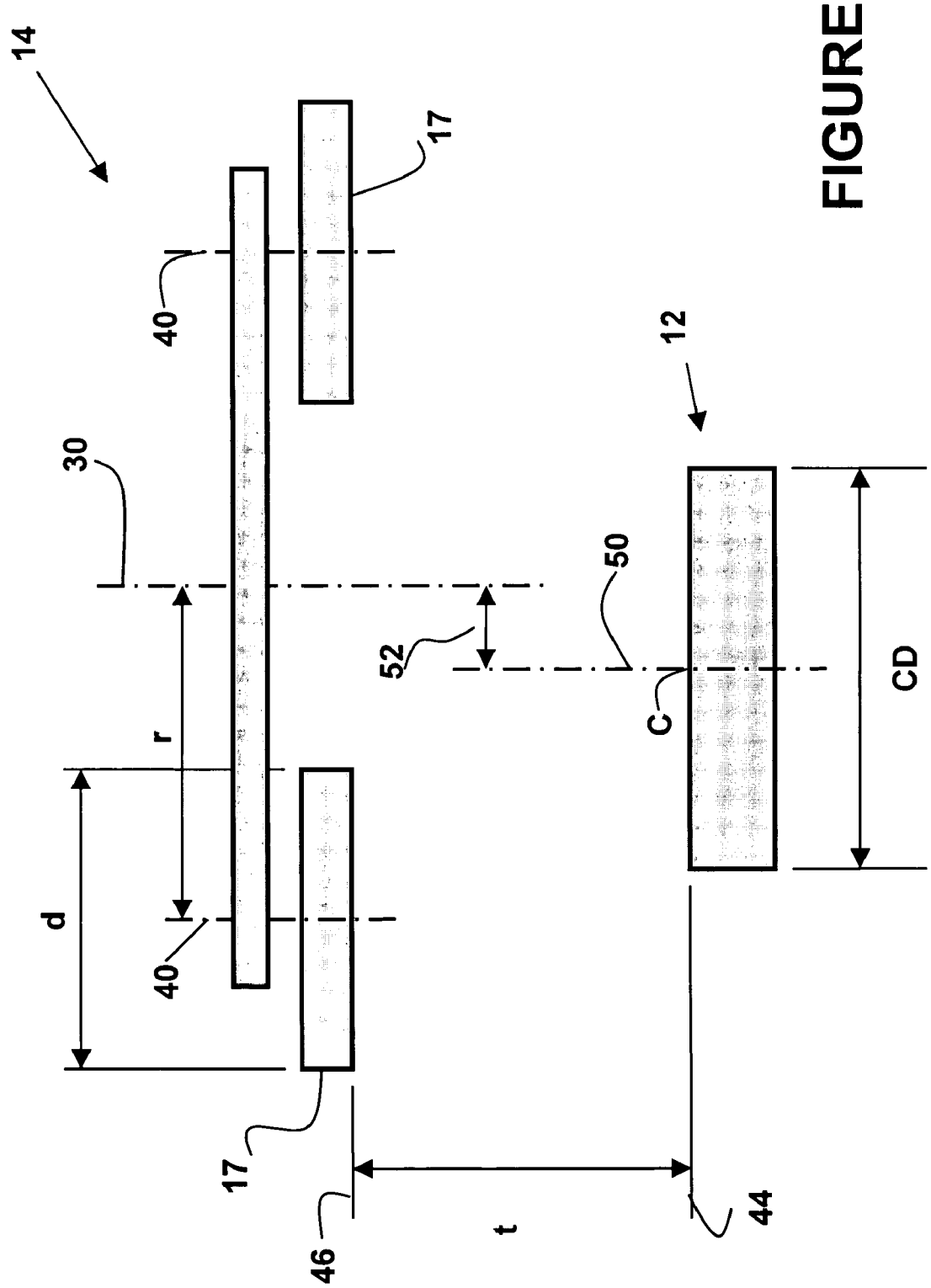
FIG. 2A is a schematic illustration of the cathode to planet geometry of the present invention and the parameters thereof.

Parameters of the geometry of the present invention are illustrated in FIG. 2A. The planetary drive system indicated generally at 14 has a central rotational axis 30 and secondary axes 40 disposed a rotation radius r apart. Planets 17 carried by secondary axes 40 each have a planet diameter d defining a largest usable coating area. An object plane 46 is illustrated at the coating surface of the substrates or other objects. A throw distance t is measured between the object plane 46 and the target surface plane 44 of the cathode 12. Cathode 12 has a center point marked C and a cathode diameter CD. A cathode central axis 50 is illustrated translated from the central rotational axis 30 by a cathode displacement distance 52.

The planets in a planetary coating geometry are mounted at a common distance r from the central rotational axis 30. Usually it is desired to arrange the planets as closely as possible for best coating material use. Each planet can support single or a plurality of substrates, optical prisms, lenses or other objects 23. The object 23 to be coated can comprise a plurality of smaller separated parts mounted on a support substrate. The planet diameter d merely defines the usable coating area for each planet 17. A planet 17 in structure need not be this dimension itself, but is able to support a substrate 23 of this diameter, or multiple objects 23 to be coated within this area. In a preferred embodiment, large objects such as bulk optics may have a thickness of up to 32 mm. A height adjustment mechanism in the planetary drive mounting or the cathode mounting allows throw distance compensation for different substrate or object thicknesses. For a planet diameter d, a number of planets n, and the required separation between planets s, the radius r at which each planet rotates around the central rotational axis 30 is for the closest arrangement given by:

$$r = (d+s)/2 \sin \alpha \qquad \text{[Equation 1]}$$

with $$\alpha = 360°/2n \qquad \text{[Equation 2]}.$$

By locating the cathode 12 on axis 30 with the planetary drive system 14 the coating process is consistent over the plurality of substrates 23. An off axis geometry creates high and low coating rate zones, which must be equalized by higher rotational speed to minimize the thickness variation from one planet to the next. As a result, the rotation speed of the central rotational axis 30 can be substantially lower than for asymmetric devices. This is preferred since the slower rotation speed reduces wear on the drive system 14 and consequently produces fewer particles that compromise the coating quality.

Figure 3:
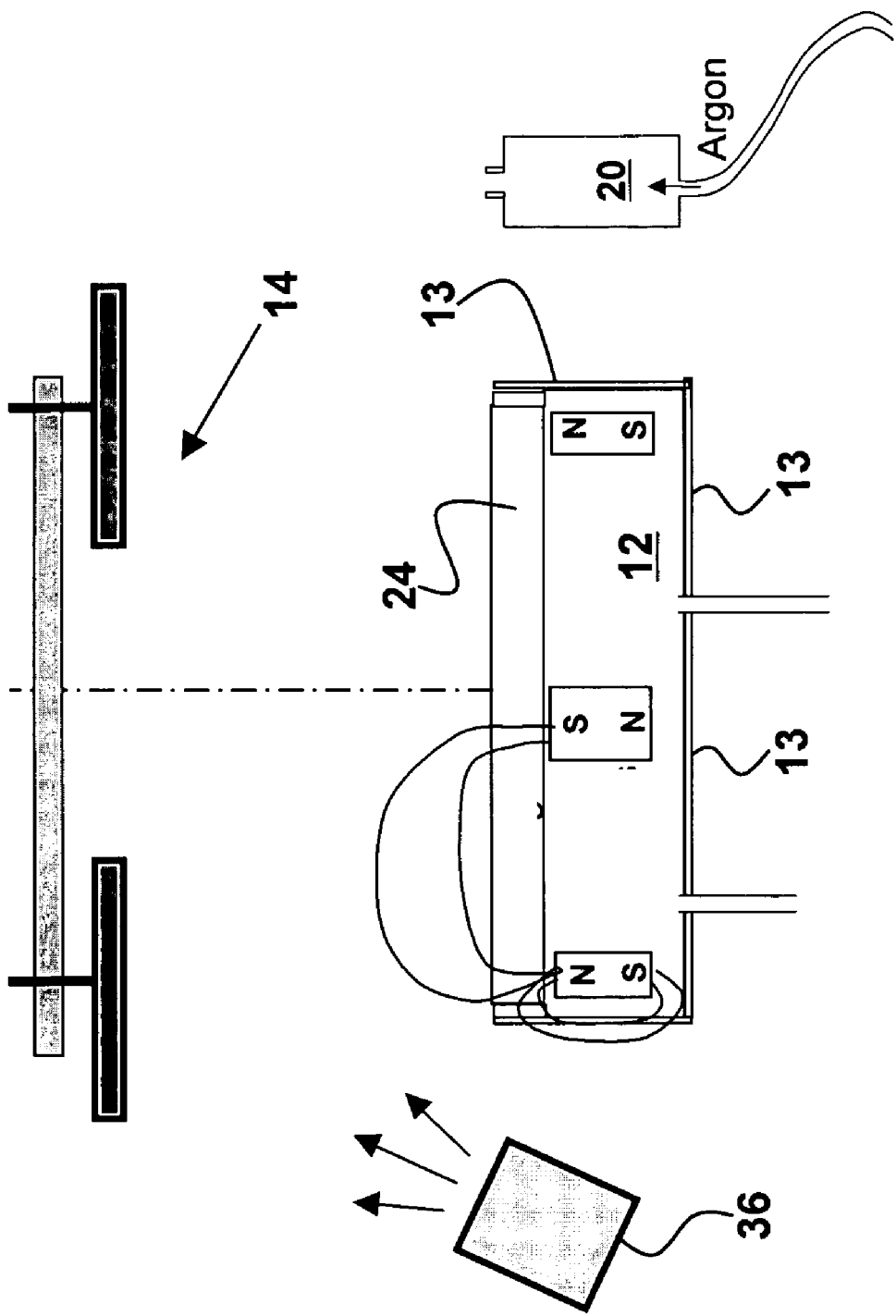
FIG. 3 is a schematic view of a preferred cathode, a preferred anode and an activated reactive source disposed within a coating chamber in accordance with an embodiment of this invention.

The cathode 12 as illustrated in FIG. 3 having a target 24 of coating material has a diameter larger than demonstrated in the prior art for a closely packed planetary drive system with 5 to 8 planets, which serves to increase the coating rate with lower defects. The cathode diameter, CD, is greater than the planet diameter d and less than twice the planet diameter d. The larger cathode diameter reduces the power density at the target 24 despite a high total power in the cathode 12. This minimizes charge buildup on the target 24 and resultant arcing. The thermal load is distributed over a larger cathode area, which makes target cooling easier. Since material is sputtered from a larger area, the erosion rate at the target surface is lower compared to the sputtering of the same amount of coating material from a smaller target. This increases the temporal stability of the process. In addition more coating material is available which extends the periods between target replacements. A target 24 with cylindrical symmetry such as a circular or annular source is the best match for the symmetry of the planetary drive system 14. Especially for larger cathode diameters, "circular" is understood to include an annular geometry. Further details of a preferred cathode are disclosed in U.S. Ser. No. 11/177,465 owned by the assignee of the present invention and herein incorporated by reference.

Figure 9:
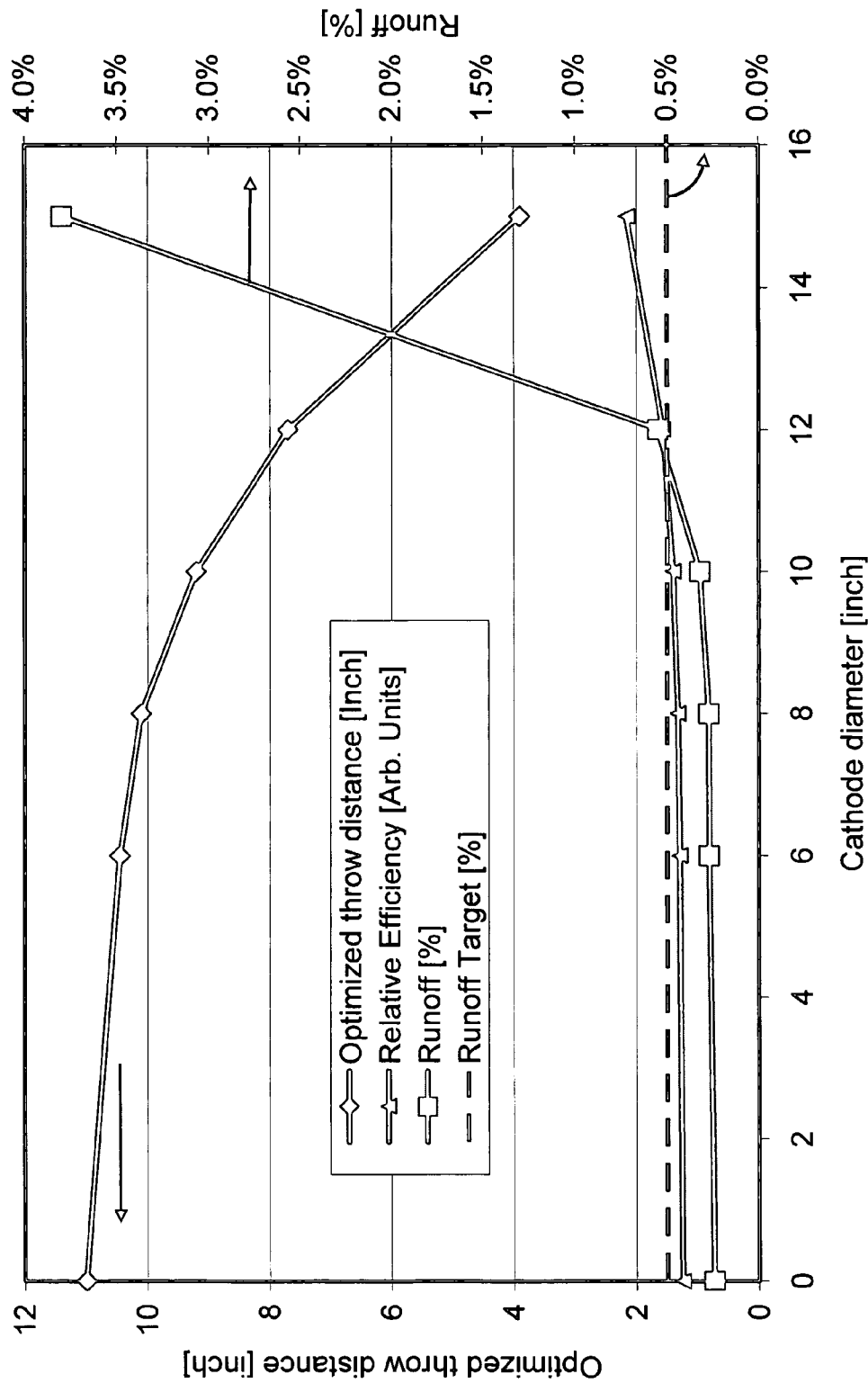
FIG. 9 is a graph illustrating increasing cathode diameter and optimized throw distance for maintaining minimum runoff in accordance with the model.

In the geometry of this invention increasing the throw distance t makes the target look more like a point source and eventually leads to a coating heavy area in the middle of the planet area. Decreasing the throw distance t increases coating on the periphery of the planet area. An ideal relation yielding low radial runoff can be found between these two extremes. FIG. 9 shows how the target diameter can be increased while the throw distance is optimized in each case to minimize runoff. The calculation is performed for the case of six closely packed 8 inch diameter planets with 0.5 inch separation between them. Surprisingly the cathode diameter can be increased to 1.5 up to twice the size of the planet, without significantly affecting the low runoff. Beyond that size the runoff increases very rapidly. Masking would need to be employed for low runoff coatings for a cathode diameter that is above twice the planet diameter.

Pulsed DC magnetron sputtering utilizing a large cathode is the preferred process. In the preferred embodiment, multiple 0.25 in. thick, 12 in diameter targets of coating material are installed in the machine. This amount of coating material combined with high utilization lasts for many runs. In the preferred embodiment refurbishing the machine is required only every week under continuous apparatus operation. The period can be extended by increasing the target volume or using multiple cathodes with the same coating material. Alternatively, the invention can also be implemented in DC magnetron and AC magnetron sputtering.

Figure 4B:
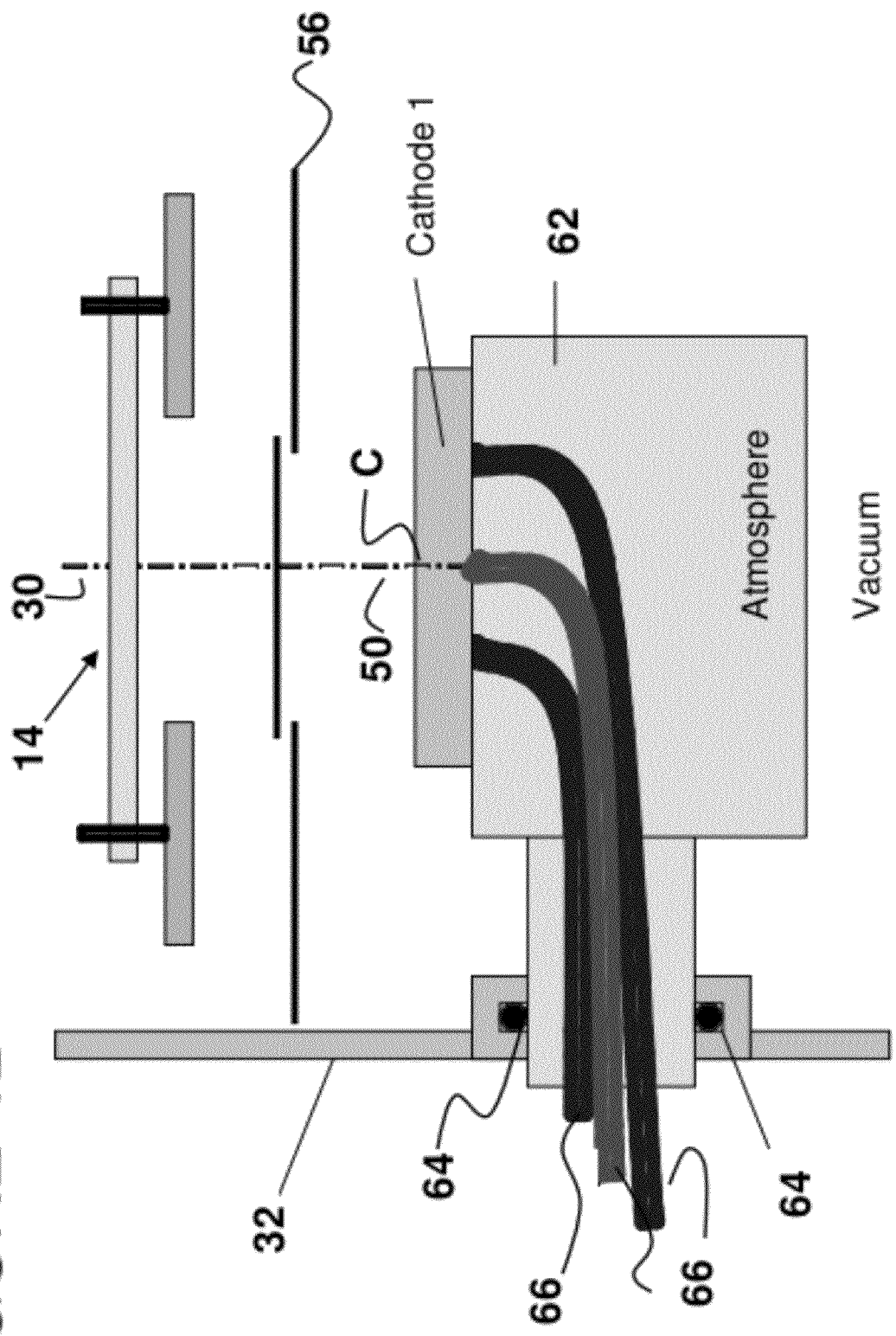
FIG. 4B is a schematic cross-sectional view taken through line B-B of the cathode exchange mechanism of FIG. 4A.

At least one cathode 12 is mounted inside the coating chamber 2. Extra cathodes 12 may be provided for backup in case of failure or in case the coating supply in one cathode 12 becomes exhausted. Alternatively, several different cathodes 12 can be provided to enable the deposition of different coatings consecutively without opening up the process chamber 2 to the atmosphere. Optical coatings are frequently made up of multiple layers of different materials. In these cases multiple targets are needed. An example of a multiple cathode exchange mechanism 60 is shown in FIGS. 4A and 4B. A cathode exchange mechanism 60 permits highly accurate placement of one of the two or more (in this case three) different sputtering cathodes 12 in precisely the same location in a deposition chamber. In this embodiment, the two, three or more cathodes 12 are placed on a rotating fixture 62, so that the cathodes 12 may be rapidly and accurately positioned through a rotational motion. The rotation system base 62 is on axis with the central axis of the device. As shown in FIG. 4A, cathode 1 is in the coating position. By rotation rotating the base 120 or 240 degrees any of the three cathodes can be positioned in coating location. The inside of the cathode base 62 is at atmospheric pressure as shown in FIG. 4B. The base 62 has a rotatable seal 64 against vacuum where it is attached to the chamber wall 32 or door. The electrical and cooling water connections 66 to the cathodes are at atmospheric pressure and are routed out of the cathode base 62 through the chamber wall 32. The invention may be employed in a manner that makes additional use of the cathode exchange mechanism, for example a sputtering target 24 may be conditioned (or "burned-in") when it is oriented downwards to enable debris to fall away from the cathode. Many alternative mechanisms can be used to exchange the cathodes. Such mechanisms can be based on other rotary or linear translations. A retractable shutter 56, shown in FIG. 4B can be closed to protect the substrates 23 while a newly positioned cathode 12 is conditioned or burned-in within the coating chamber under vacuum, prior to the coating process. In the open position the shutter 56 does not significantly obstruct the coating flux from the target to the substrates.

Adjustments can be made to the position of the cathode 12 to alter the throw distance by movement of a mounting platform for the cathode 12 or the rotary drive 14, or both. This can be done manually or by activating a motor. Such adjustment can also be made to improve the geometry for different materials, or to maintain the distance as the target is eroded from use. In the preferred embodiment the cathodes can be positioned through the described exchange mechanism and the entire planetary drive system can be height adjusted through controlled motors. The adjustment can be made with the process chamber under vacuum.

A demand for low defect concentration in coated devices such as optical filters, mirrors, and semiconductor circuits requires a cathode that will have little or no arcing at the sputtering target. In FIG. 3, a cathode 12 is shown with an anode 20, wherein gas is fed into the chamber, away from the cathode 12 through the anode 20. This avoids high pressure in small volumes close to the cathode 12 where the magnetic field is high, for example between the dark-space shield (NOT SHOWN) and cathode 12 where sputtering has to be prohibited. Preferably the anode opening 21 is at least 2 inches away from the cathode 12 to enable a uniform pressure distribution over the target area 24. The anode voltage has been found to be insensitive to the distance between anode and cathode. In this preferred cathode embodiment the non-impinged surfaces 13 of the cathode are electrically insulated. The electrical insulation can be accomplished by the use of insulating materials such as Kapton™ tape, Teflon™ or a ceramic or through application of an insulating coating such as dense alumina applied through a plasma spray coating process. Alternatively surfaces 13 of the cathode can be exposed to normal atmosphere where air becomes the electrical insulator. Furthermore, increasing the cathode diameter so as to lessen the magnetic field that extends beyond the cathode body reduces the arcing. By insulating an extended cathode by plasma spraying alumina on its non-impinged sides and insulating the bottom with a Teflon™ plate it is possible to reduce the arc rate from >100 arcs/s to <0.1 arcs/s for the same high deposition rate. The cathode can be driven with any electrical mode (DC, pulsed DC, and dual cathode AC).

Figure 3A:
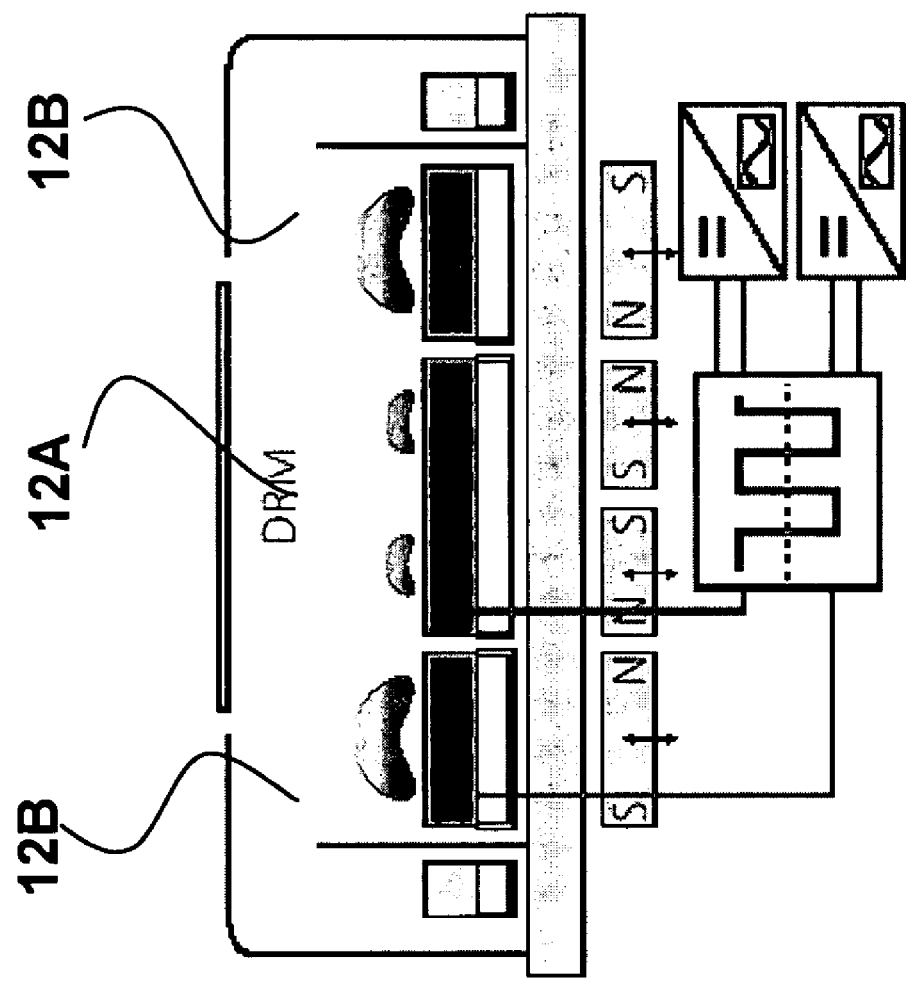
FIG. 3A is a schematic illustration dual ring cathode in cross-section, which replaces the cathode and anode of FIG. 3 in an AC magnetron sputtering device in accordance with the present invention.

The anode (not shown in FIG. 2) provides a charge differential to the negatively charged cathode. This can be provided as simply as an electric charge provided to the chamber walls 32. Numerous prior art anodes have been proposed to overcome the problems of the anode becoming coated with the coating material and the anode location moving to other surfaces in the system, many of these anodes function at very high voltages which increase the problems of arcing. In an AC system the anode function is provided alternately by the cathode itself. A dual ring cathode 12A/12B shown in FIG. 3A is preferred for use in the present invention. In this embodiment an AC voltage is applied cyclically between the two cathodes 12A, 12B. During the off-cycle the inactive cathode acts as the anode. An advantage of this embodiment is that during the sputtering period, coating material is cleaned off the anode.

Figure 5:
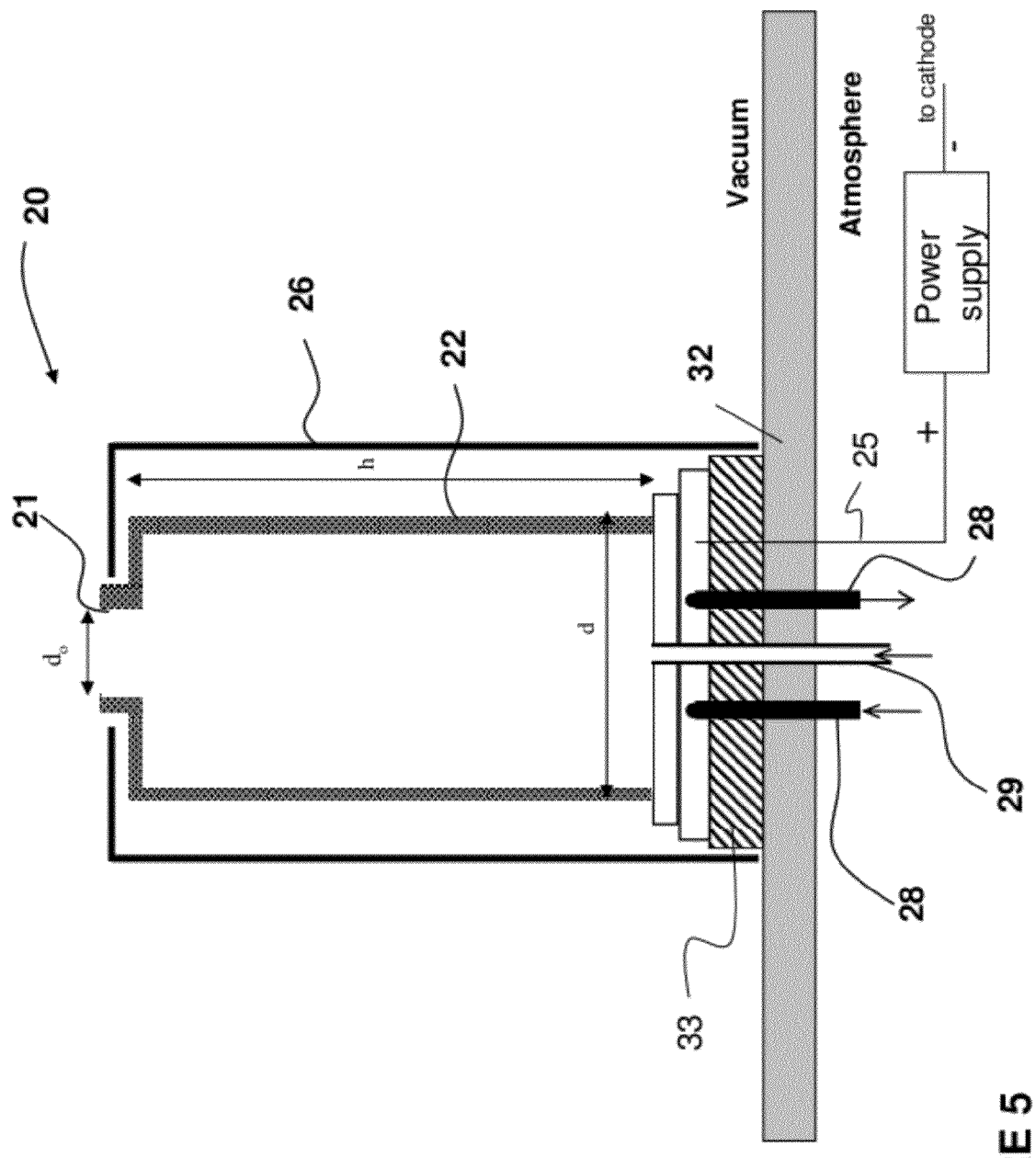
FIG. 5 is a cross sectional view of a cylindrical hollow anode of FIG. 3, wherein the anode is located within the coating chamber.

A preferred anode 20 for use in the present invention, shown in detail in FIG. 5, is disclosed in related application U.S. Ser. No. 11/074,249 filed Mar. 7, 2005 and owned by the assignee of the present invention. Referring now to FIG. 5 an anode 20 is shown in the form of a container or vessel having interior conductive walls of copper or stainless steel 22 having an opening 21 at a first end for communicating with a vacuum chamber 2 to which it is directly coupled. The outside walls 26 of the container 20 are referred to hereafter as the outer body and may be electrically insulated. In the cross sectional view water cooling pipes 28 are shown substantially around the anode 20 for maintaining the temperature of the anode in operation. A gas inlet port 29 is shown for providing a conduit into which sputter gas may enter the anode cavity to pressurize the anode. The anode body 20 can be disposed external to or within the vacuum coating chamber 2. Furthermore, the opening 21 can be located on a side or end of the anode vessel. In operation the anode 20 is pressurized with argon gas which promotes the formation of plasma in the coating chamber 2 in the presence of a suitable ignition voltage and maintenance voltage thereafter. Pressure within the vessel prevents coating material from entering and interfering with the operation of the anode 20. Positive power supply lead 25 connects the power supply to the inner conductive walls 22 of the anode 20. The anode shown in FIG. 5 was designed to function with a low anode voltage and little or no arcing. A low anode voltage of approximately 30 volts is preferred to reduce process variation. The anode 20 is electrically insulated from the grounded chamber walls 32 by an insulating material 33.

The optimum anode parameters, that is, area, anode ground distance, and pressure, led to a preferred embodiment where the anode comprises a vessel of cylindrical shape with a diameter of at least d=10 cm and a length of at least h=20 cm with an opening (21) to the vacuum chamber (2) at one end as shown in FIG. 5. For low scattering processes the chamber pressure is below 2 mTorr. A high pressure at the anode is achieved by reducing the opening 21 of the anode 20 and feeding the process gas into the anode 20 via the inlet port 29. An optimum opening has an area of about 20 cm$^2$ and is preferably round. In operation the anode 20 can be pressurized to more than 3 mTorr. It is expected that this anode 20 can run in nearly continuous operation for extended periods of time; experiments have been carried out running this anode for more than 2000 hours continuously without having to take the anode 20 out of service to be cleaned or changed, and it is believed that it is possible to operate the anode for more than 10,000 hours of continuous operation.

Many optical coatings require the deposition of oxides or other compounds. Such materials are preferably produced in reactive sputter mode where a metallic target is sputtered and oxygen, nitrogen, or another reactive gas is added to the process. The sputtered material and the activated oxygen species arrive simultaneously at the substrate. The optimum flow, of oxygen for example, for the optimum oxygen partial pressure needs to be found. If the oxygen flow is too low, the films are not stoichiometric and have high absorption losses. If it is too high, the target surface becomes more oxidized than necessary preventing operation at the highest possible deposition rate. The sputter rate for a metallic target can be ten times higher than that of a fully oxidized target. In its basic form, the reactive gas flows through a mass flow controller and enters the coating chamber through a simple gas line or a complex manifold. The oxidation effectiveness can be increased if the oxygen is activated and directed at the substrates.

The present invention comprises placing the activated reactive source 36 in close proximity to the growing film thereby increasing the chance that the activated species will impinge on the growing thin film coating before hitting a chamber wall (or other gas molecules). The use of a directed oxygen activation or acceleration device 36 shown in FIG. 3 helps the formation of stoichiometric films while minimizing the target oxidation. Such a device can be an inductively or capacitively coupled plasma source with or without an extraction or acceleration system. The source output can be ionized or otherwise activated oxygen species (e.g. atomic oxygen, ozone). The activated oxygen source 36 is positioned just at the target surface plane 44 or such that the cathode 12 is between the oxygen source 36 and the object plane 46 to be outside the line of sight from the sputtered target surface 24, as it is important to prevent massive coating buildup at the oxygen source 36. In the present invention a large cathode 12 is used, which is positioned closer to the substrates 23 compared to the use of a smaller cathode. Thus the target surface plane 24 is close to the object plane 46 which allows moving the oxygen activation source 36 closer to the substrates 23 while keeping it free from massive coating buildup. That increases the oxidation effectiveness and allows to coat at higher rates. The direction of the output should be optimized for best oxidation effectiveness.

In the preferred embodiment of this aspect of the invention the output orifice of an inductively coupled reactive activation source is located 13 inches outside the cathode center C, 0.75 inch under the target surface plane 44 and directed with a 30 degree angle towards the center 30 of the planetary rotary drive system 14.

In this preferred embodiment physical coating rates of 1.2 nm/s for $SiO_2$, 1.2 nm/s for $Nb_2O_5$ and 1.5 nm/s for $Ta_2O_5$ have been achieved with laser mirror quality. The main rotary drive system was operated at 60 rpm for achieving above rates.

The use of one oxygen source outside the cathode breaks the cylindrical symmetry of the coating apparatus. The use of two oxygen sources that are arranged in opposite locations in relation to the cathode center has been successfully tested. That reduces the need for fast main rotary drive rotation, but adds process complexity. An ideal configuration would be a circular oxygen source to maintain the cylindrical symmetry.

The reactive sputter process is disclosed for oxides. All aspects can similarly be applied to nitrides or other reactive processes.

Figure 10:
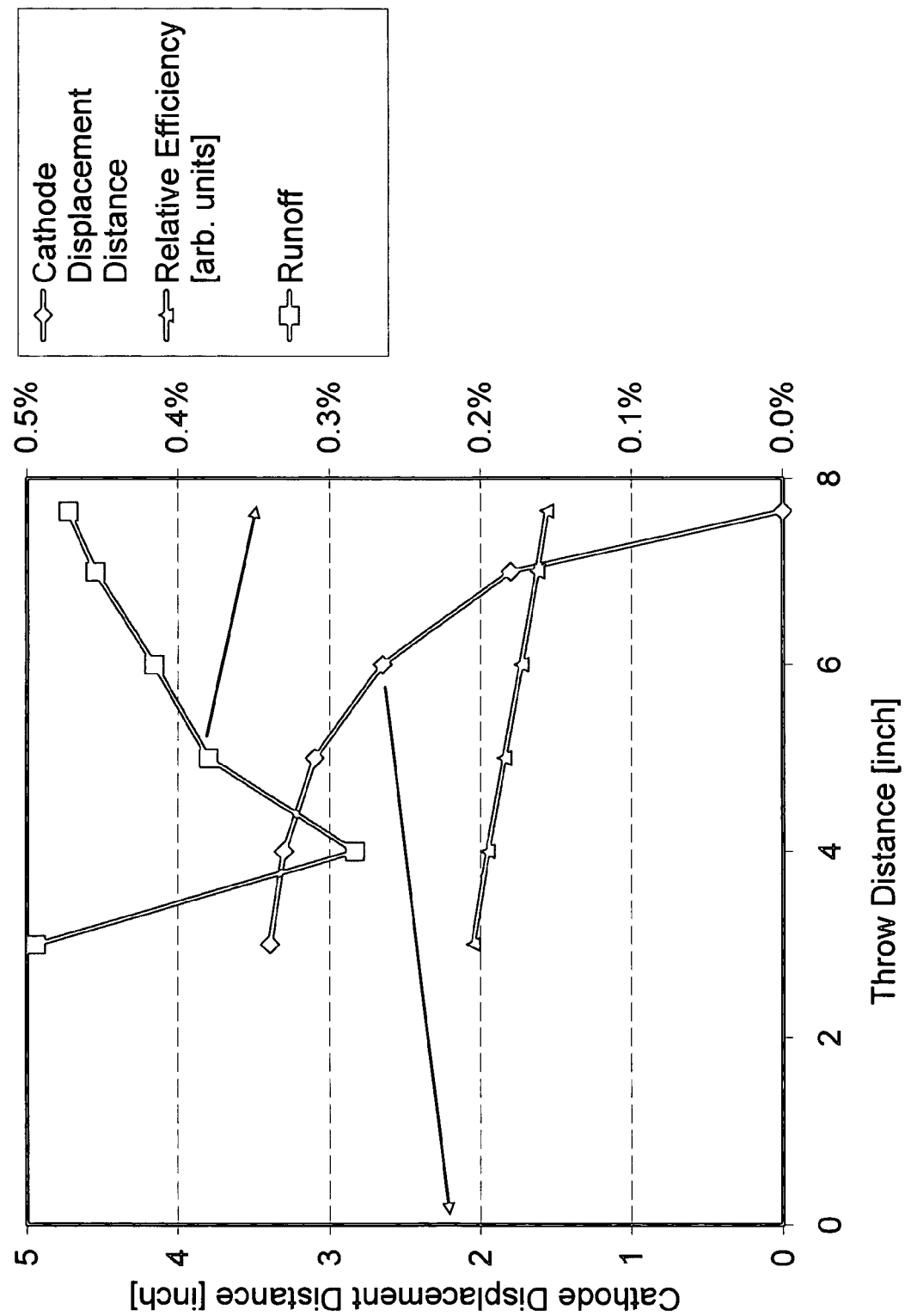
FIG. 10 is a graph illustrating an optimized geometry for a cathode displaced from the central axis and an optimized throw distance in accordance with the cathode displacement.

An alternative to the preferred large cathode on-axis geometry, discussed above, is to locate the large cathode 12 slightly off-axis from the planetary drive system 14, while moving it even closer to the substrate plane. This maintains the high deposition rate and suppressed arc rate of the present invention. FIG. 10 graphically demonstrates the case of 6 closely packed 8 inch substrates with 0.5 inch separation for a 12 inch diameter cathode without a mask. At a throw distance of 7.7 inch the runoff is at its minimum when the cathode is on axis with the rotary drive system. As the cathode is brought closer to the substrates it needs to be displaced from the rotational center. According to the simulations the runoff is slightly reduced over the on-axis embodiment. In this example this holds true until the cathode is displaced about ¼ of its diameter. Then the runoff rises abruptly. In the range of the cathode displacement from no displacement up to ¼ of the cathode diameter, operation without a mask can yield runoff under 0.5%. At larger displacements the runoff rises rapidly and masking needs to be employed if low runoff is required.

In this variant the symmetry between the cathode and the rotary drive system is broken and the benefits thereof are lost. As a substrate is transported by the planetary drive system it moves between high and low flux deposition zones. If a high uniformity from planet to planet is required for short layers, the main rotary drive speed must be much higher compared to the previously discussed symmetric solutions. That brings process complications and can lead to higher defect generation.

In operation, one aspect of reducing cycle time comprises reducing the non-coating time in the process. One example is to reduce the amount of time required to pump and to vent the chamber. A technique often used is to include a load lock for loading and unloading objects for coating. This allows the deposition chamber to remain under reduced pressure vacuum conditions at all times. Reduced pressure meaning below atmospheric pressure. A part handling system is required for loading and unloading substrates or other objects into the chamber.

The coating chamber 2 shown in FIGS. 1 and 2 is evacuated through pumping port 22, while process gases are supplied to the process chamber 2 via mass flow controllers (not shown). The gate valve 3 shown in FIG. 1, enables the pressure in the load lock chamber 1 to be brought to atmospheric pressure for loading and unloading of substrates or to be re-established to the pressure of the coating chamber 2 for substrate transfer, independently of the pressure in the process chamber 2. The load lock chamber 1 includes a loading container 4 with a cassette elevator 5, and a transfer channel 6 with a robotic arm 7. The control mechanism for the robotic arm 7 is mounted in the cylindrical canister 8 extending from the transfer channel 6.

The actual coating time is minimized by coating at a fast deposition rate. Fast rates are achieved by using an extended cathode and an optimized geometry between the substrates or objects and the cathode that will be described in detail below. Pulsed DC magnetron sputtering is the preferred coating process since the duty cycle of the cathode can be 90 percent or more. Reducing or eliminating arcing at the cathode also reduces arc recovery time. Through careful design no masking is required to control runoff on the substrates. This increases coating rates, and reduces downtime caused by increased arcing, and cleaning the mask surfaces. Throughput is also higher without masking since flaking from the masks can cause defects in the coating quality.

The coating overhead time is reduced by coating all materials in the same deposition chamber. The present invention includes a cathode exchange mechanism 60 (see FIGS. 4A and 4B) for sequentially positioning multiple cathodes for different coating layers in a single run. Additionally, cathodes can be conditioned within the chamber before a coating layer begins by closing a shutter 50 (see FIG. 4B) that shields the substrates during the conditioning process. Combining the shutter with the cathode arrangement 60 reduces overhead time when switching from one material to the next one.

Turnaround time for refurbishing the apparatus is minimized by installing easily removable and re-installable hard foil over many of the surfaces. By maintaining several sets of tooling, a fast exchange of the hard foil quickly restores the device to service.

Many optical coatings have discriminating features in their spectral response. For example an edge filter for color separation lets one color pass while rejecting other colors. For the purpose of this disclosure the precision requirement across a whole 200 mm substrate for the coating is assumed to be 0.5%. For the example above, if the edge were at 500 nm, this would translate to a 2.5 nm absolute edge placement variation. The placement of the spectral feature is related to the thickness of the layers in the coating design. Thus, the variation in coating rates across the 200 mm substrate needs to be below 0.5%. If multiple substrates are coated in the same batch, the variation from one substrate to another needs to be a fraction of that. The variation in placement of a spectral feature is also referred to as runoff.

Figure 6:
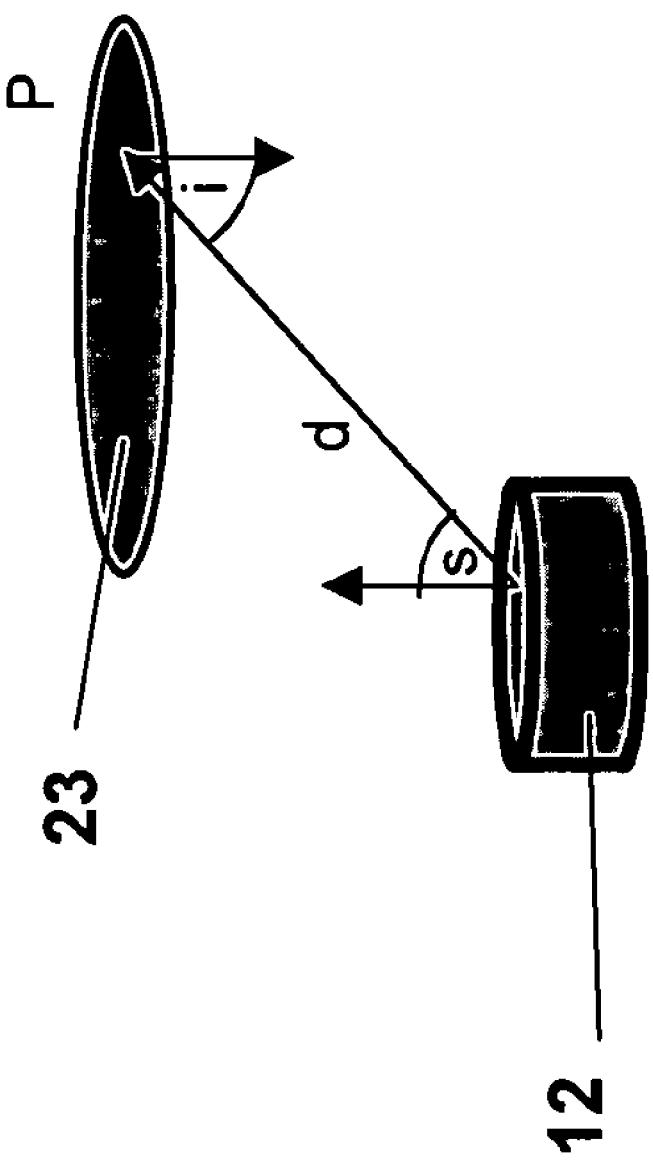
FIG. 6 comprises a schematic illustration of the cathode to substrate geometry of the model for defining the parameters of the invention.

The performance of the geometry of the present invention had been predicted through numerical modeling. In the model it is assumed that at any instant in time the thickness deposit at a point P on a substrate is proportional to $$\cos^f(s)\cos(i)/d^2 \qquad \text{[Equation 3]}$$

where s is the angle between the line of coating and the source normal, i is the angle between the source (target) and point P. These parameters are illustrated in FIG. 6. Equation 3 implies that the distribution from the target is axially symmetric and that the sticking coefficient does not depend on the coating incidence angle. The term f is an empirically determined constant describing the emission characteristic of the target. For the simulations here a value of 0.7 has been used. Extended targets having a large diameter are approximated as an array of weighted point sources. The deposited thickness at any instant in time is the sum of the contributions from all point sources.

To estimate substrate runoff multiple points along a radial line across the substrate are evaluated. Since the substrates rotate around their own centers, no azimuthal asymmetry is expected. The locations of these points in a planetary rotary drive system are determined in small time intervals and the coating material for each point is accumulated according to the Equation 3 above. The runoff is determined by creating a ratio of the largest to the lowest coating accumulation on the substrate.

Figure 7:
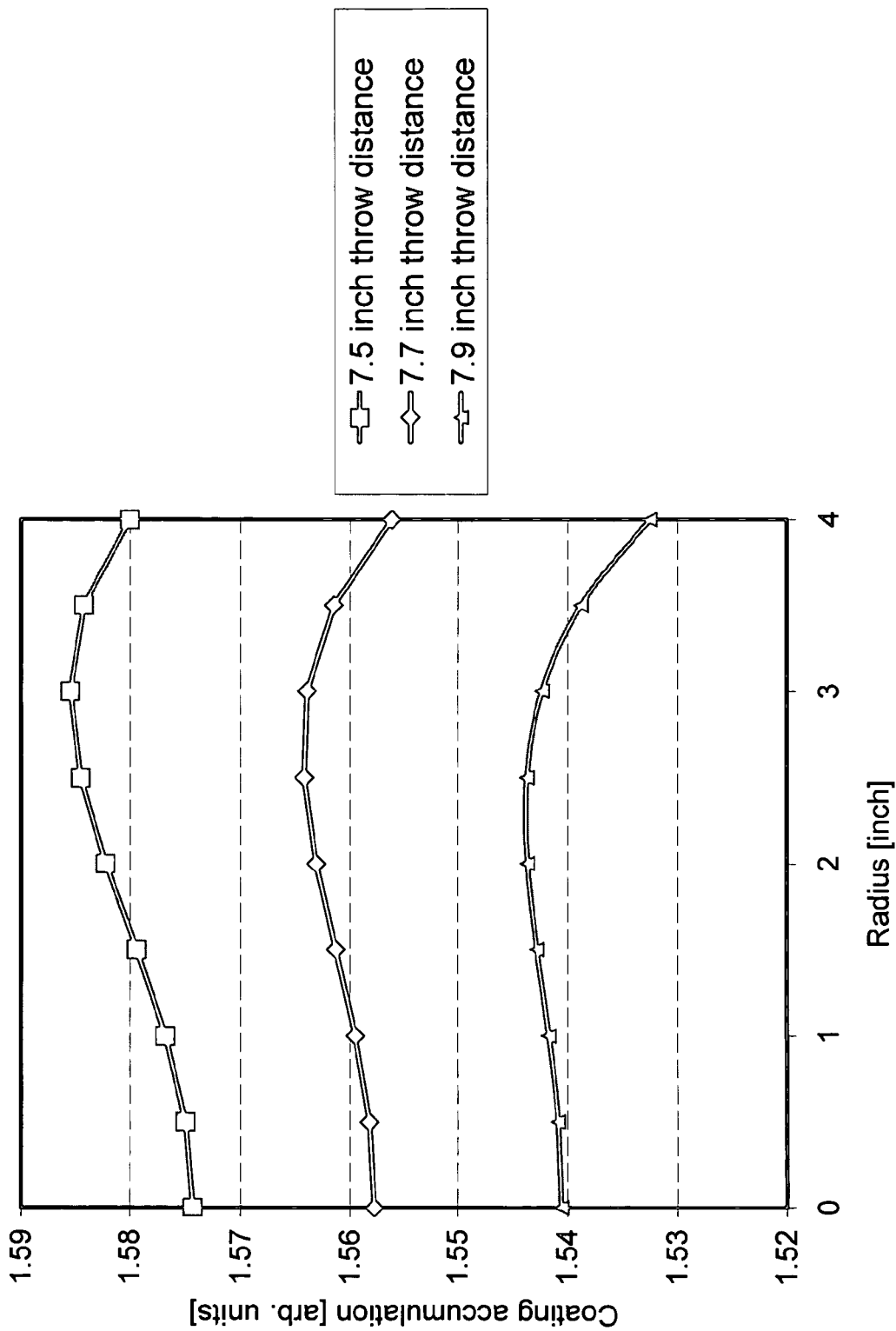
FIG. 7 is a graph illustrating data points of a simulation of coating accumulation for different throw distances in accordance with the model.

FIG. 7 shows an example of the results from one of these simulations. The calculation was done for an 8 inch diameter substrate and a 12 inch diameter extended coating target for three different throw distances. The coating rate becomes higher for shorter throw distances. As a second order effect it is observed that the rate at the outside of the substrate rises faster relative to the rate at the center. That leads to a tilt in the runoff across the part and affects the absolute runoff. For 7.5 inch throw distance, the runoff is (1.585/1.574)−1=0.70%; for 7.7 inch throw distance (1.564/1.556)−1=0.51%; for 7.9 inch throw distance (1.544/1/533)−1=0.72%. For each coating geometry a throw distance can be found where the runoff is minimized. For the case above that would be at 7.7 inches. The lowest possible runoff is achieved when the rate at the part center and the part edge are equal.

Figure 8:
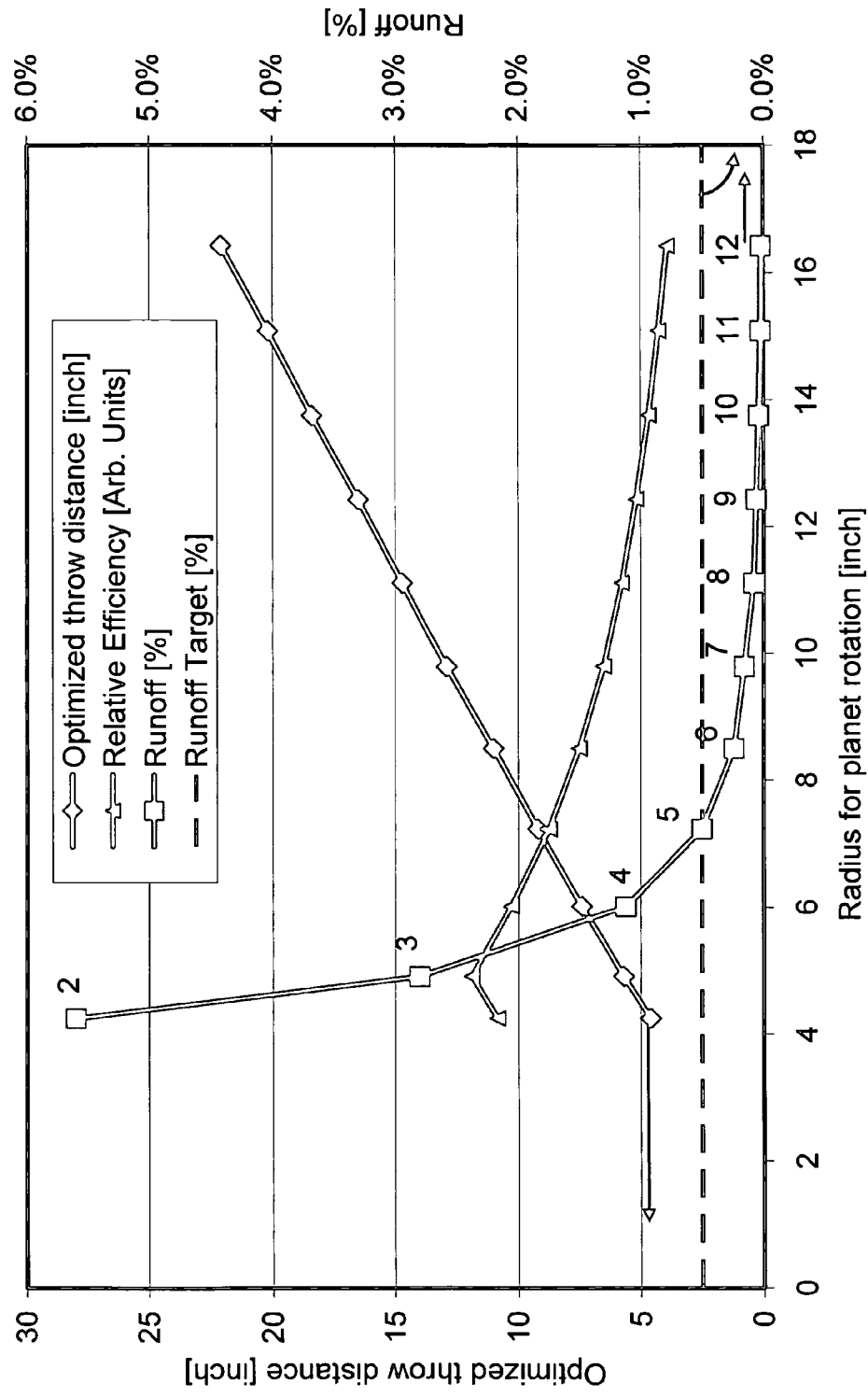
FIG. 8 is a graph illustrating a simulated runoff as a function of planet radius over a range of two to twelve planets.

FIG. 8 shows the simulated runoff as a function of planet radius for a single point source. The data are calculated for two to twelve planets of 8 inch substrate diameter and 0.5 inch planet to planet separation. The number of planets is written next to each runoff result. In each simulation the throw distance between the point source and the rotary drive plane was optimized for the smallest runoff. The optimum throw distance shows a nearly linear relationship to the planet rotation radius. I.e. the angle between a line from the substrate center to the source center and the target surface is constant. For an 8 inch planet, the optimum angle is about 35 degrees.

FIG. 8 illustrates that when only two or three planets are used, the runoff is rather high, well in excess of 0.5%. The runoff drops rapidly when going to higher substrate counts. For five planets the runoff falls under 0.5% and is further reduced for more substrates. This reveals an optimum number of planets as five and greater. FIG. 8 also includes an estimate of the coating material utilization (relative efficiency). The utilization is the highest for three planets and drops steadily for more planets. A compromise between low runoff and coating material usage suggests an optimum number of planets as five to eight. This is illustrated graphically in FIG. 8. The number of planets is written next to each runoff result. In each simulation the throw distance between the point source and the object plane was optimized for the smallest runoff. The closest planet packing, with the assumption that the separation s is as small as practical can be expressed by the following formula:

$$0.85*d < r < 1.3*d$$

where d is the planet diameter and r is the planetary drive system radius, e.g. from the central rotational axis 30 to a secondary axis 40.

As discussed above, for low defect coatings at high coating rates it is desirable to have a large extended source. The size of a cathode, as used here, describes the largest diameter of material used on the target. Many different cathodes with different magnetic and shielding configurations exist. Thus the emission characteristic for the same size cathode of different models is expected to be slightly different. The emission characteristic is also influenced by the specific progress conditions like pressure, voltages, etc. As the target size is increased, the throw distance needs to be reduced to maintain minimum runoff. This relationship is illustrated in FIG. 9 for 8" diameter planets that are mounted on a 8.5" rotation radius. For example, a point source would need to be mounted 11 inches from the substrate plane. For an 8 inch diameter cathode, the optimized throw distance is about 10 inches, and for a 12 inch cathode the throw distance is less than 8 inches. The runoff remains low, close to the point source value, until the target diameter becomes about 1.5 times the diameter of the planet d. For cathodes larger than this the runoff increases rapidly. To maintain a runoff under 0.5%, the target diameter should be less than 1.5d; to maintain a runoff under 2%, the target diameter should be less than 2d. The optimum throw distance t for operation without a mask is between $0.7d < t < 1.3 d$. The efficiency of material use also increases with a larger cathode size, that is a higher fraction of the sputtered target material is deposited on the substrates.

Figure 11:
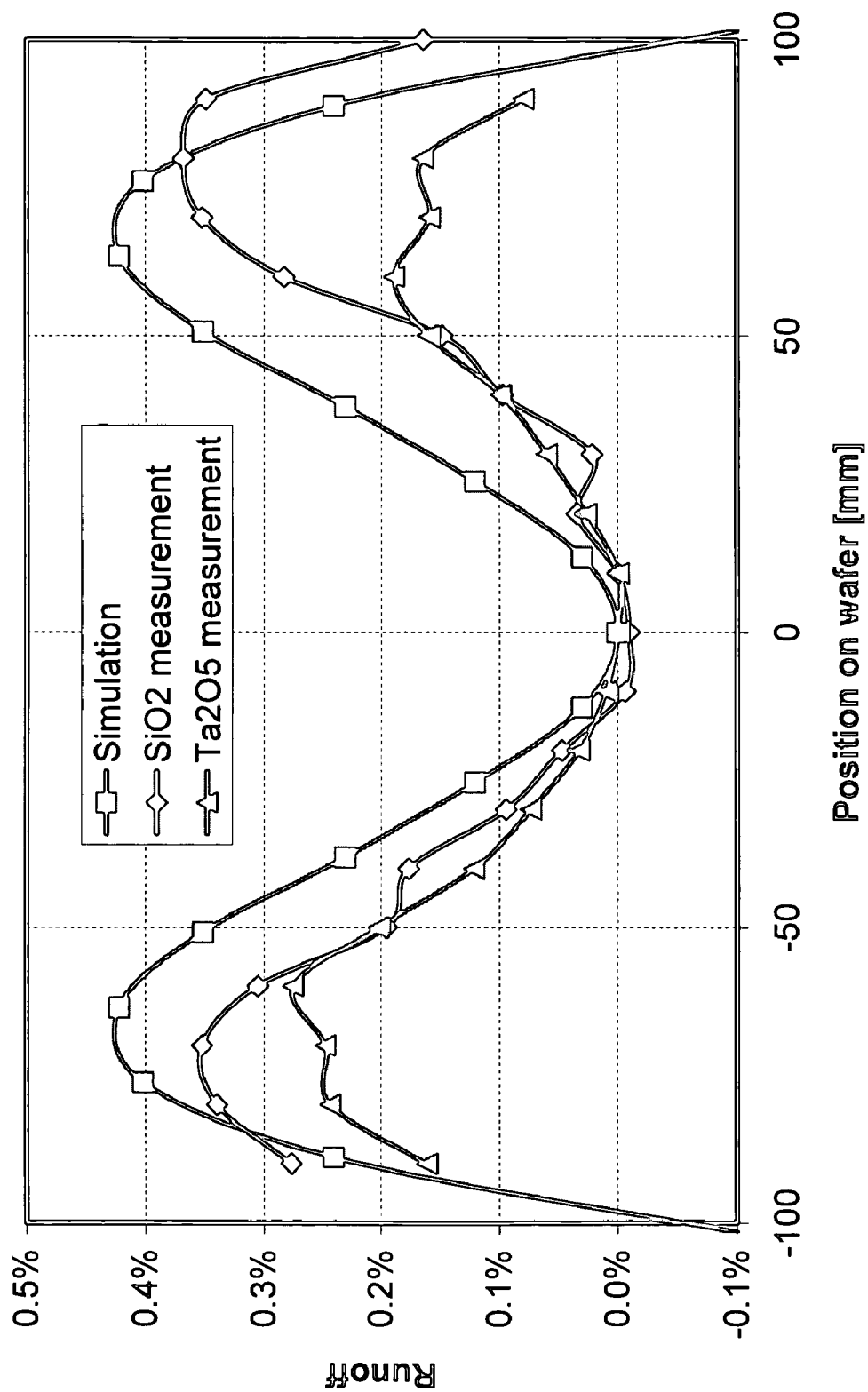
FIG. 11 is a graph illustrating actual measured runoff for a coating device of the present invention overlaying simulated runoff according to the model demonstrating the validity of the simulations.

In a preferred embodiment of the present invention six 200 mm substrates are rotated at 8.5 inch primary radius of the planetary drive system. The throw distance t for minimized runoff is typically between 7.5 and 8 inches, depending on the material applied. The cathode size is 12 inches in diameter. Deposition rates of 1.2 nm/s for $SiO_2$ and $Nb:Ta_2O_5$ and 1.5 nm/s for $Ta_2O_5$ have been demonstrated in this configuration. The material utilization is estimated to be 25%. The part runoff without a mask is below 0.5%. FIG. 11 shows thickness measurements of actually coated parts in this geometry overlaid with the simulated runoff through modeling. The measured runoff is under 0.5% for $SiO_2$ and $Ta_2O_5$. The results demonstrate the validity of the simulations. The runoff can be further minimized by reducing the substrate diameter. Runoff under 0.2% can be achieved in the above geometry over a 150 mm diameter substrate at the expense of reduced material utilization.

The model discussed above was verified using 200 mm diameter substrates. However, the modeling is invariant to scaling. The same geometry can be applied to smaller or larger substrates. All figures illustrate the sputter up configuration. However, the geometry considerations are invariant to the spatial orientation. Sputter down, horizontal or any other orientation is possible.

What is claimed is:

1. A magnetron sputtering device for applying a coating to an object comprising:
    a planetary drive system including a central rotational axis and a plurality of planets disposed substantially equidistant from the central rotational axis, each planet having a secondary axis adapted for independent rotation and a diameter defining a coating area, each planet adapted to support one or more objects in an object plane, wherein a distance from the central rotational axis to the secondary axes comprises a rotation radius of the planetary drive system;
    a circular cathode including a target comprising material for forming the coating having a surface plane disposed a throw distance from the object plane, the cathode having a center point, and having a cathode diameter greater than the planet diameter and up to twice the planet diameter;
    anode means for providing a voltage difference to the cathode, such that electrons are returned to the anode means;
    a chamber having walls for housing the cathode and the planetary drive system adapted to be evacuated in operation; and
    a gas delivery system for providing a flow of sputter gas into the chamber,
    wherein the rotation radius of the planetary drive system and the throw distance are between half and twice the size of the planet diameter thereby providing minimized radial runoff of the coating quality without the use of a mask,
    and wherein the anode means comprises a conductive interior surface of a vessel electrically connected to a positive potential of a power supply having a single opening in communication with a chamber interior, and the conductive interior surface is surrounded by an electrically insulated outer body and electrically isolated from the walls of the chamber,
    and wherein the gas delivery system providing the flow of sputter gas is disposed within the vessel, the opening and the flow of gas being operative to pressurize the anode vessel before passing through the opening into the chamber.

2. A magnetron sputtering device as defined in claim 1, wherein the center point of the cathode is substantially aligned with the central rotational axis thereby defining a central axis of the device.

3. A magnetron sputtering device as defined in claim 1, wherein the center point of the cathode is translated from alignment with the central rotational axis up to a third of the cathode diameter.

4. A magnetron sputtering device as defined in claim 1 further including means for adjusting the throw distance between the surface plane of the target and the object plane.

5. A magnetron sputtering device as defined in claim 1, wherein the cathode is supported on a cathode exchange mechanism for changing the target in the chamber under vacuum.

6. A magnetron sputtering device as defined in claim 5, wherein the cathode exchange mechanism can support a plurality of target materials for applying a plurality of different material layers to the objects during a single run.

7. A magnetron sputtering device for applying a coating to an object comprising:
- an electrically charged cathode including a target comprising material for forming the coating, the cathode having a center point;
- a planetary drive system disposed a throw distance from the source including a central rotational axis and a plurality of planets each supported on a secondary axis adapted for independent rotation and disposed equidistant from the central rotational axis, each planet adapted to support an object through two degrees of rotational movement;
- a chamber having walls for housing the cathode and the planetary drive system adapted to be evacuated to reduced pressure in operation;
- electrically charged anode means for providing a voltage difference to the cathode comprising a conductive interior surface of a vessel electrically connected to a positive potential of a power supply having a single opening in communication with a chamber interior, and the conductive interior surface is surrounded by an electrically insulated outer body and electrically isolated from the walls of the chamber;
- a gas delivery system for supplying a sputter gas to the chamber for forming a plasma, wherein each of the plurality of planets has a diameter d, each secondary axis is disposed at a rotation radius r such that $0.85*d<r<1.3*d$, the throw distance t between the cathode and the planetary drive system is $0.7*d<t<1.3*d$, and the cathode circumscribes material having a cathode diameter CD about its center point such that $d<CD<2*d$.

8. A magnetron sputtering device as defined in claim 7, wherein the central rotational axis is substantially aligned with the center point of the cathode defining a central axis of the device.

9. A magnetron sputtering device as defined in claim 7, wherein the center point of the cathode is translated from alignment with the central rotational axis up to a quarter of the diameter of the cathode.

10. A magnetron sputtering device as defined in claim 7, wherein the rotation radius r equal to the distance from the central rotary axis to the secondary axes is defined as $r=(d+s)/2 \sin(\alpha)$ where $\alpha=360°/2n$, d=planet diameter, s=planet separation and n=number of planets.

11. A magnetron sputtering device as defined in claim 10, wherein the planets each have a diameter d with a separation s as small as practical between them, are defined by $0.85*d<r<1.3*d$ in relation to the rotation radius r.

12. The magnetron sputtering device of claim 7 further including means for adjusting the throw distance t between the planetary drive system and the cathode while the chamber is under vacuum.

13. The magnetron sputtering device of claim 7 wherein the number of planets is between 5 and 8.

14. The magnetron sputtering device of claim 7, wherein the planet diameter is 8 inches or less.

15. The magnetron sputtering device of claim 1, comprising one of a DC and a pulsed DC magnetron device.

16. The magnetron sputtering device of claim 1, wherein the cathode is electrically insulated on all non-impinged surfaces.

17. The magnetron sputtering device of claim 1, wherein the cathode is annular.

18. The magnetron sputtering device of claim 1, wherein the vessel containing the anode is disposed outside the chamber and includes a single opening in communication with the chamber interior.

19. The magnetron sputtering device of claim 1, wherein the secondary axes are substantially parallel to the central rotational axis.

20. The magnetron sputtering device of claim 7, wherein the source of sputter gas is disposed within the vessel.

21. The magnetron sputtering device of claim 1, wherein an activated reactive gas is directed toward the objects from a reactive source disposed such that the surface plane of the target is between the reactive source and the object plane.

22. The magnetron sputtering device of claim 7, wherein the cathode diameter is at least 10 inches.

* * * * *